(12) United States Patent
Kobayashi et al.

(10) Patent No.: US 11,338,746 B2
(45) Date of Patent: May 24, 2022

(54) AUTOMOBILE ARCHITECTURE

(71) Applicants: SUMITOMO WIRING SYSTEMS, LTD., Mie (JP); SUMITOMO ELECTRIC INDUSTRIES, LTD., Osaka (JP); TOYOTA JIDOSHA KABUSHIKI KAISHA, Toyota (JP)

(72) Inventors: Kenta Kobayashi, Mie (JP); Akira Kitabata, Mie (JP); Takaya Kohori, Tochigi (JP); Masayuki Ishikawa, Tochigi (JP); Taiko Sato, Okazaki (JP); Hiroyuki Ishikawa, Kasugai (JP)

(73) Assignees: SUMITOMO WIRING SYSTEMS, LTD., Mie (JP); SUMITOMO ELECTRIC INDUSTRIES, LTD., Osaka (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/043,553

(22) PCT Filed: Apr. 16, 2019

(86) PCT No.: PCT/JP2019/016299
§ 371 (c)(1),
(2) Date: Sep. 29, 2020

(87) PCT Pub. No.: WO2019/203226
PCT Pub. Date: Oct. 24, 2019

(65) Prior Publication Data
US 2021/0024018 A1 Jan. 28, 2021

(30) Foreign Application Priority Data
Apr. 16, 2018 (JP) ............................. JP2018-078706

(51) Int. Cl.
*B60R 16/023* (2006.01)
*B60R 16/02* (2006.01)
(Continued)

(52) U.S. Cl.
CPC ........ *B60R 16/023* (2013.01); *B60R 16/0207* (2013.01); *B60R 16/0231* (2013.01);
(Continued)

(58) Field of Classification Search
None
See application file for complete search history.

(56) References Cited

U.S. PATENT DOCUMENTS 4,386,278 A * 5/1983 Kawada ............... B60R 16/0207
307/9.1
5,204,815 A * 4/1993 Yamamoto ......... B60G 17/0195
180/415
(Continued)

FOREIGN PATENT DOCUMENTS

CN 1352799 A * 6/2002 ......... H01B 11/1091
CN 203387021 U 1/2014
(Continued)

OTHER PUBLICATIONS

Nomura; "Technology Trends of Automotive Sensor;" Journal of The Surface Finishing Society of Japan; 2016; pp. 628-632; vol. 67, No. 12.
(Continued)

*Primary Examiner* — Timothy J. Dole
*Assistant Examiner* — Muhammed Azam
(74) *Attorney, Agent, or Firm* — Oliff PLC

(57) ABSTRACT

An automobile architecture includes a composite cable, a main electronic control unit, a subsidiary electronic control unit, a motor sensor, and a wheel velocity sensor. In the architecture, the composite cable connects the main elec-
(Continued)

tronic control unit and the subsidiary electronic control unit, and the motor sensor and the wheel velocity sensor are connected to the subsidiary electronic control unit.

13 Claims, 4 Drawing Sheets

(51) Int. Cl.
*B60R 16/03* (2006.01)
*B60R 16/06* (2006.01)
*H01B 7/00* (2006.01)
*H05K 7/00* (2006.01)
*B60T 13/74* (2006.01)
*H01B 7/18* (2006.01)

(52) U.S. Cl.
CPC .......... *B60R 16/0239* (2013.01); *B60R 16/03* (2013.01); *B60R 16/06* (2013.01); *H01B 7/0009* (2013.01); *H05K 7/005* (2013.01); *B60T 13/74* (2013.01); *H01B 7/1875* (2013.01)

(56) References Cited

U.S. PATENT DOCUMENTS

| | | | |
|---|---|---|---|
| 6,810,316 B2 | 10/2004 | Yokoyama et al. | |
| 7,289,897 B2 | 10/2007 | Yokoyama et al. | |
| 7,516,823 B2 | 4/2009 | Kikuchi et al. | |
| 8,169,794 B2 * | 5/2012 | Matsukawa | H02G 11/00 361/826 |
| 9,000,301 B2 | 4/2015 | Hayakawa et al. | |
| 9,463,756 B2 | 10/2016 | Hayakawa et al. | |
| 9,862,336 B2 | 1/2018 | Hayakawa et al. | |
| 9,902,347 B2 | 2/2018 | Hayakawa et al. | |
| 9,905,338 B2 | 2/2018 | Hashimoto et al. | |
| 9,948,047 B2 | 4/2018 | Hayakawa et al. | |
| 10,224,683 B2 | 3/2019 | Hayakawa et al. | |
| 10,262,774 B2 | 4/2019 | Hashimoto et al. | |
| 10,279,756 B2 | 5/2019 | Hayakawa et al. | |
| 10,468,157 B2 | 11/2019 | Hashimoto et al. | |
| 10,547,150 B2 | 1/2020 | Hayakawa et al. | |
| 10,576,916 B2 | 3/2020 | Takamatsu et al. | |
| 10,647,274 B2 | 5/2020 | Takamatsu et al. | |
| 10,861,621 B2 | 12/2020 | Hashimoto et al. | |
| 2003/0057705 A1 * | 3/2003 | Kusumi | H05K 7/1432 290/40 C |
| 2003/0083797 A1 | 5/2003 | Yokoyama et al. | |
| 2005/0065696 A1 | 3/2005 | Yokoyama et al. | |
| 2008/0236964 A1 | 10/2008 | Kikuchi et al. | |
| 2013/0277087 A1 | 10/2013 | Hayakawa et al. | |
| 2014/0326480 A1 * | 11/2014 | Hashimoto | H01B 7/295 174/113 R |
| 2015/0165987 A1 | 6/2015 | Hayakawa et al. | |
| 2015/0165988 A1 | 6/2015 | Hayakawa et al. | |
| 2016/0339854 A1 | 11/2016 | Hayakawa et al. | |
| 2017/0264062 A1 | 9/2017 | Hayakawa et al. | |
| 2018/0025808 A1 | 1/2018 | Hashimoto et al. | |
| 2018/0134239 A1 | 5/2018 | Hayakawa et al. | |
| 2018/0191114 A1 | 7/2018 | Hayakawa et al. | |
| 2019/0115123 A1 | 4/2019 | Hashimoto et al. | |
| 2019/0118739 A1 | 4/2019 | Takamatsu et al. | |
| 2019/0118742 A1 | 4/2019 | Takamatsu et al. | |
| 2019/0118743 A1 | 4/2019 | Takamatsu et al. | |
| 2019/0123472 A1 | 4/2019 | Takamatsu et al. | |
| 2019/0123480 A1 | 4/2019 | Takamatsu et al. | |
| 2019/0123920 A1 | 4/2019 | Takamatsu et al. | |
| 2019/0123937 A1 * | 4/2019 | Takamatsu | B60R 16/02 |
| 2019/0126864 A1 | 5/2019 | Takamatsu et al. | |
| 2019/0126865 A1 | 5/2019 | Takamatsu et al. | |
| 2019/0157824 A1 | 5/2019 | Hayakawa et al. | |
| 2019/0210543 A1 | 7/2019 | Hayakawa et al. | |
| 2020/0013525 A1 | 1/2020 | Hashimoto et al. | |
| 2020/0168359 A1 | 5/2020 | Kohori et al. | |

FOREIGN PATENT DOCUMENTS

| | | | |
|---|---|---|---|
| CN | 106024118 A * | 10/2016 | |
| DE | 10058899 A1 * | 5/2002 | ............ B60K 26/00 |
| DE | 10141263 A1 * | 3/2003 | ......... B60R 16/0207 |
| EP | 1000813 A1 * | 5/2000 | ......... B60R 16/0207 |
| EP | 1266801 A2 * | 12/2002 | ............ B60L 58/10 |
| JP | 4154883 B2 | 9/2008 | |
| JP | 2008238987 A | 10/2008 | |
| JP | 2013-237428 A | 11/2013 | |
| JP | 2014-141192 A | 8/2014 | |
| JP | 5594446 B2 | 9/2014 | |
| JP | 2014-220043 A | 11/2014 | |
| JP | 2017-65374 A | 4/2017 | |
| JP | 2017-76629 A | 4/2017 | |
| JP | 2018-030463 A | 3/2018 | |
| WO | WO-0042686 A1 * | 7/2000 | ........... B60N 2/0224 |
| WO | 2016/151752 A1 | 9/2016 | |
| WO | 2017/046847 A1 | 3/2017 | |
| WO | WO-2017149824 A1 * | 9/2017 | ............ G06F 13/00 |
| WO | 2017/209298 A1 | 12/2017 | |
| WO | 2017/222077 A1 | 12/2017 | |
| WO | WO-2018070314 A1 * | 4/2018 | ............ B60R 16/03 |
| WO | WO-2018079008 A1 * | 5/2018 | ........ B60W 50/0098 |

OTHER PUBLICATIONS

Jul. 16, 2019 Search Report issued in International Patent Application No. PCT/JP2019/016299.
Aug. 31, 2021 Office Action issued in Chinese Patent Application No. 201980023171.7.
Sep. 21, 2021 Office Action issued in Japanese Patent Application No. 2020-514392.
Mar. 29, 2022 Office Action issued in Japanese Patent Application No. 2020-514392.

* cited by examiner

AUTOMOBILE ARCHITECTURE

TECHNICAL FIELD

The present disclosure relates to an automobile architecture.

BACKGROUND ART

In recent years, an electrically controlled electric brake has attracted attention in automobile field. For example, Patent Document 1 discloses that a composite cable, which includes a pair of signal lines that is connected to a sensor for measuring a rotation velocity of wheels, a pair of power supply lines that is connected to a brake caliper, and a sheath that covers the pair of signal lines and the pair of power supply lines all together, is used in an electric brake.

PRIOR ART LITERATURE

Patent Document

Patent Document 1 Japanese Patent No. 5594446

SUMMARY OF THE DISCLOSURE

Problems to be Solved by the Invention

In the composite cable for an electric brake, the number of the signal lines tends to increase, for example, for the purpose of measurement to acquire information for controlling a motor by various sensors in order to improve the control function of the motor equipped on a brake caliper of the electric brake. In addition, automobiles in recent years have widely adopted systems for automatically controlling intermittent brake braking/brake releasing in case wheels are locked when the brake is applied. Accordingly, some signal lines are additionally required to transmit an electrical signal from a wheel velocity sensor for detecting a rotation velocity of automobile wheels.

The present inventors have acknowledged that if the number of the signal lines is increased in a composite cable that connects a main electronic control unit and a subsidiary electronic control unit in an electric brake in order to reflect the above-mentioned circumstances, the composite cable becomes too large in diameter such that for example, a composite cable for use in an architecture as shown in FIG. 5 needs three cores for a motor, two cores×6=12 cores for a sensor, so that number of power supply lines and signal lines amounts to 15 cores in total. In the design of automobiles, layout of a composite cable is arranged in the final step, specifically, the composite cable is disposed in a remaining space. The present inventors have acknowledged a multicore composite cable including 15 cores or such cannot be disposed in a vehicle, and then have conceived the idea to reduce the diameter of a composite cable.

The present disclosure has been made in view of such a problem, and it is intended to provide an automobile architecture which makes it possible to achieve reduction of a cable diameter.

Means for Solving the Problems

One aspect of the present disclosure is an architecture, including: a composite cable; a main electronic control unit; a subsidiary electronic control unit; a motor sensor; and a wheel velocity sensor, wherein the composite cable connects the main electronic control unit and the subsidiary electronic control unit, and the motor sensor and the wheel velocity sensor are connected to the subsidiary electronic control unit.

Effects of the Invention

According to the present disclosure, it becomes possible to provide an automobile architecture which makes it possible to achieve reduction of a cable diameter.

MODES FOR CARRYING OUT THE INVENTION

Figure 1:
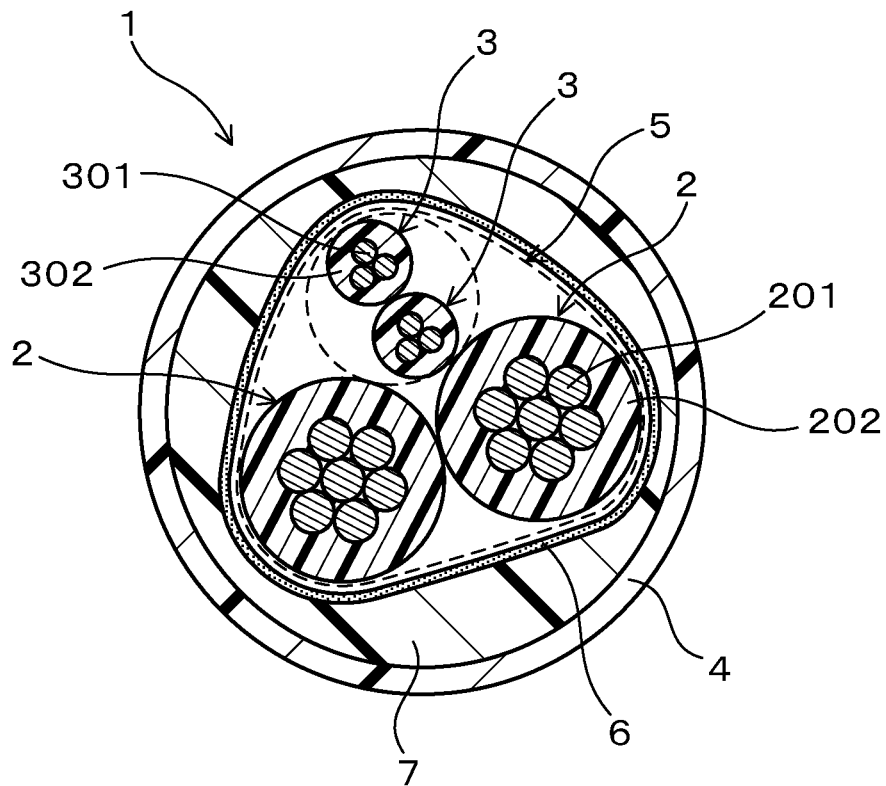
FIG. 1 is an illustration schematically showing a cross section of a composite cable for use in an architecture according to Embodiment 1, the cross section being perpendicular to the center axis of the cable.

Description of Embodiments in the Present Disclosure

First, embodiments in the present disclosure will be listed for the sake of explanation.

An architecture according to the present embodiment includes a composite cable, a main electronic control unit, a subsidiary electronic control unit, a motor sensor, and a wheel velocity sensor, wherein
the composite cable connects the main electronic control unit and the subsidiary electronic control unit,
and the motor sensor and the wheel velocity sensor are connected to the subsidiary electronic control unit.

The architecture according to the present embodiment has been achieved in the following manner.

The present inventors investigated an architecture (circuitry) for on-vehicle components to reduce the diameter of a composite cable.

In an architecture in the past (details of which will be described later with reference to FIG. 5), a wheel velocity sensor was connected directly to a main electronic control unit. In such a configuration, it is necessary for a composite cable that connects the main electronic control unit and a subsidiary electronic control unit to have a signal line for transmitting a signal from the wheel velocity sensor and a signal line for transmitting a signal from a motor sensor both prepared independently. So, the present inventors have arrived at an idea of integrating the signal line for the wheel velocity sensor and the signal line for the motor sensor. Then, in order to integrate the signal line for the wheel velocity sensor and the signal line for the motor sensor together, the present inventors conceived an idea of connecting the wheel velocity sensor to the subsidiary electronic control unit. And then, they conceived an idea of transmitting a superimposed signal having the signal related to the wheel velocity sensor and the signal related to the motor sensor.

In this way, the architecture of the present embodiment makes it possible to reduce the diameter of a composite cable, to thereby prevent a risk such that the composite cable cannot be disposed in a vehicle.

It is noted that even a person skilled in the art would not arrive at the idea of integrating signal lines unless there are particular reasons such as a need for reduction of the diameter of a composite cable.

Information in connection with control of a motor such as of motor temperature, information of the rotation speed of a wheel, and so on are continuously stored in the subsidiary electronic control unit from the sensor constantly. Then, the main electronic control unit reads the information in connection with control of a motor, the information such as of rotation speed of a wheel from the subsidiary electronic control unit.

In the meantime, when the main electronic control unit reads the information from the subsidiary electronic control unit, the information has to be given a priority order to be read. This is because the main electronic control unit can read only one piece of information from the subsidiary electronic control unit when using CAN communication. It is noted that only one piece of readable information means that one communication transmits information having one (fixed) data length. For example, higher priority is placed on information such as rotation speed of a wheel so that the information can be read without intermission. On the other hand, for example, lower priority is placed on information such as temperature of a motor because such information has not to be so frequently read in comparison with the case of the rotation speed of a wheel.

The architecture according to the present embodiment has been achieved for the first time in response to the circumstance that there is no sufficient space to lay out a composite cable, and thus reduction in diameter is required for the composite cable, and as one measure to secure the space, the order of priority is set in the information to be read.

If the circumferences as mentioned above were not be acknowledged, even the person skilled in the art would never reach such a measure as superimposing signals with disregard to a possible increase in design cost to control the signals, which is caused by superimposing the signals.

The architecture according to the present embodiment as mentioned above makes it possible to provide an automobile architecture which makes it possible to achieve reduction of a cable diameter.

The architecture according to the present embodiment may be configured such that the main electronic control unit and the subsidiary electronic control unit transmit and receive a CAN communication.

The architecture according to the present embodiment may be configured such that the composite cable includes a pair of power supply lines, a pair of signal lines; and a sheath that covers the pair of power supply lines and the pair of signal lines together.

The architecture according to the present embodiment may be configured such that the pair of signal lines is not covered with a shield conductor.

The architecture according to the present embodiment may be configured such that the pair of power supply lines is not covered with a shield conductor.

The architecture according to the present embodiment may be configured such that the pair of power supply lines and the pair of signal lines are twisted together to constitute a wire bundle, and the wire bundle and the sheath are provided therebetween with an intermediate layer covering the wire bundle.

The architecture according to the present embodiment may be configured to further include a ground wire inside the sheath.

The architecture according to the present embodiment may be configured such that the composite cable includes a first connector and a second connector; the second connector has a sub wire extended therefrom; the sub wire has a third connector connected thereto; the first connector is connected to the main electronic control unit; the second connector is connected to the subsidiary electronic control unit; and the third connector is connected to the wheel velocity sensor.

The architecture according to the present embodiment may be configured such that a signal transmitted from the wheel velocity sensor passes through the composite cable via a circuit in the subsidiary electronic control unit, and is received by the main electronic control unit.

Detailed Description of Embodiments in the Present Disclosure

Specific examples of the architecture in the present disclosure will be described with reference to the figures. Note that the present invention is not limited to these exemplifications, and is defined by the scope of the claims, and all modifications which come within the meaning and range equivalent to the claims are therefore intended to be embraced therein.

Embodiment 1

A composite cable for use in an architecture according to Embodiment 1 will be described with reference to FIG. 1 to FIG. 6. As exemplified in FIG. 1, a composite cable 1 includes a pair of power supply lines 2, a pair of signal lines 3, and a sheath 4. A detailed explanation will be given hereafter. It is noted that the dotted-line circles in FIG. 1 show to be stranded wires. The present embodiment will be explained with an example in which the composite cable 1 is of a four-core cable structure.

In the composite cable 1, the pair of the power supply lines 2 each may be configured to include a conductor 201 and an insulator 202 that covers the outer circumference of the conductor 201. The conductor 201 may be configured to be composed of a plurality of metal element wires twisted together. The metal element wires may be formed of, for example, copper or copper alloy, or aluminum or aluminum alloy, or the like. The insulator 202 may be formed of, for example, cross-linked polyethylene (PE), or the like.

The pair of the signal lines 3 each may be configured to include a conductor 301 and an insulator 302 that cover(s) the outer circumference of the conductor 301. The conductor 301 may be configured to be composed of a plurality of metal element wires twisted together. The metal element wires may be formed of, for example, copper or copper alloy, or aluminum or aluminum alloy, or the like. The insulator 302 may be formed of, for example, cross-linked polyethylene (PE), or the like. It is noted that FIG. 1 shows an example in which the outer diameters of the pair of signal lines 3 are made smaller than those of the pair of power supply lines 2. In addition, the pair of the signal lines 3 may be configured to be twisted together from the viewpoint of enhancing shielding performance.

The sheath 4 covers the pair of power supply lines 2 and the pair of signal lines 3 together. In the present embodiment, specifically, from the viewpoint such as of covering performance of the sheath, the pair of power supply lines 2 and the pair of signal lines 3 are twisted together to constitute a wire bundle 5. Then, the sheath 4 is disposed outside of the wire bundle 5. The sheath 4 may be formed of a material, for example, polyurethane resin (PU), or the like.

The wire bundle 5 may be configured to have a pressing tape member 6 wound around the outer circumference thereof. According to this configuration, the twist of the power supply lines 2 and the signal lines 3 can be made to be hardly loosed. In addition, this configuration can prevent the power supply lines 2 and the signal lines 3 from adhering the sheath 4 and an intermediate layer 7 later described. The pressing tape member 6 is specifically made of a material, for example, papers, resins, or the like.

As shown in FIG. 1, the composite cable 1 may be configured to have the intermediate layer 7 provided between the wire bundle 5 and the sheath 4, which covers the wire bundle 5. The configuration in which the intermediate layer 7 is interposed between the wire bundle 5 and the sheath 4 makes it possible to reduce unevenness of the surface of the wire bundle 5, so that the sectional contour of the cable can be easily approximated to a circular-shape before the sheath 4 is provided. Thus, according to this configuration, the composite cable 1 having a circular cable cross-section can be easily obtained. As a material for the intermediate layer 7, for example, cross-linked polyethylene (PE), or the like can be specifically exemplified.

In the present embodiment, the composite cable 1 is used for an automotive electric brake. In an automotive electric brake system, a motor equipped on a brake caliper is actuated directly or indirectly by a main electronic control unit in response to a pedaling force of a driver, and a rotating force of the motor is converted to a mechanical pressing pressure. Consequently, a brake pad is pressed against a brake disc (in the case of a disc brake), or a brake shoe is pressed against a brake drum (in the case of a drum brake) to thereby brake the automobile.

In the composite cable 1, the pair of power supply lines 2 is configured to supply an electric power for driving a motor equipped on a brake caliper of the electric brake of an automobile. Meanwhile, the pair of signal lines 3 is configured to transmit a superimposed signal having an electrical signal concerning control of the motor superimposed with an electrical signal concerning a rotation velocity of wheels of the automobile. Hereinafter, this configuration will be described in detail with reference to FIG. 2 and FIG. 3.

Figure 2:
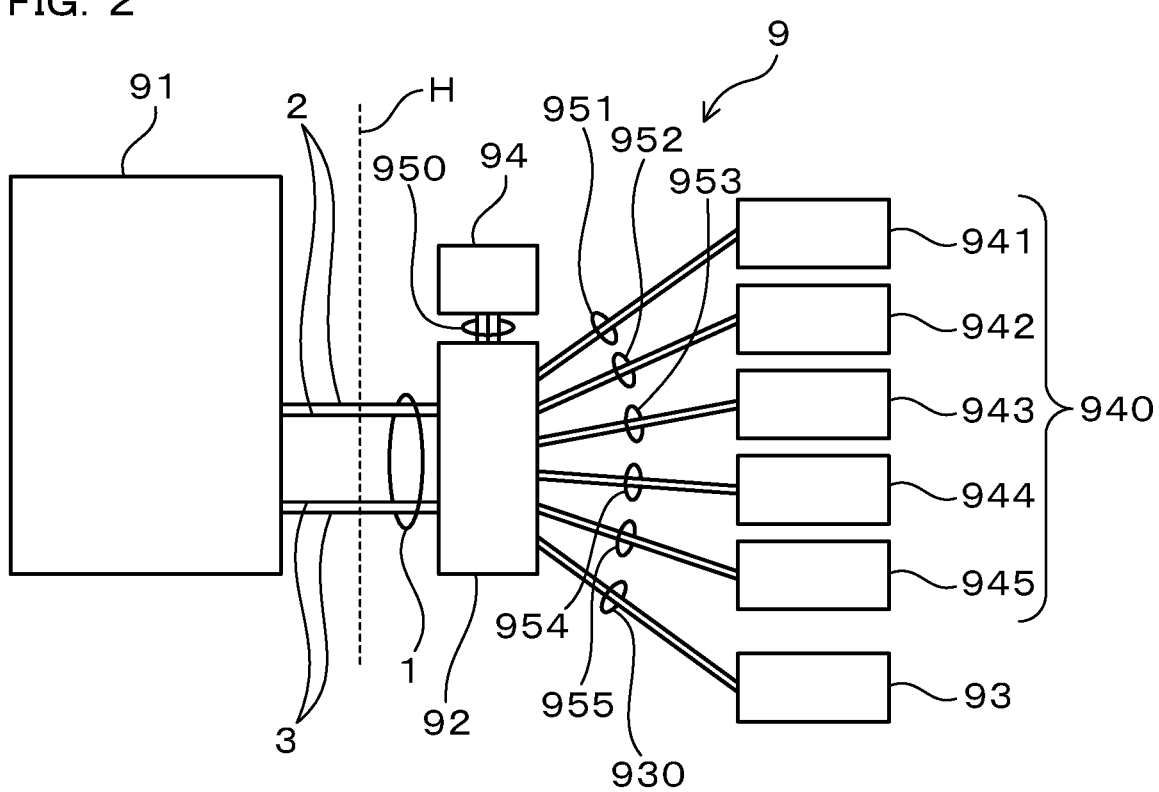
FIG. 2 is an illustration for explaining the architecture according to Embodiment 1.

FIG. 2 shows an architecture 9 of Embodiment 1. In FIG. 2, a vehicle body or an undercarriage of the automobile is positioned on the left side of a broken line H, and automobile vehicle wheels are positioned on the right side of the broken line H. As schematically shown in FIG. 2, a main electronic control unit 91 (a main ECU) is mounted on the vehicle body or the undercarriage. Further, a subsidiary electronic control unit 92 (a sub ECU) is mounted on the wheels and/or the portion around the wheels. Still further, a wheel velocity sensor 93 for detecting the rotation velocity of the wheel is mounted on the wheels and/or the portion around the wheels.

In addition to the wheel velocity sensor 93, a single motor sensor 940 or a plurality of motor sensors 940 for measurement to acquire information necessary for control of a motor 94 are provided on the wheels and/or the portion around the wheels. The sensor(s) include(s) a motor operation confirming sensor 941 for confirming operation of the motor 94 equipped on the brake caliper of the automotive electric brake, a motor temperature sensor 942 for measuring a temperature of the motor 94, a motor rotation angle sensor 943 for measuring a rotation angle of the motor 94, a motor current sensor 944 for measuring a current supplied to the motor 94, a press sensor 945 for detecting a braking force, and the like. It is noted that the portion around the wheels specifically includes, for example, the lower portion of the suspension spring of an automobile (so-called the underbody part (a chassis) of an automobile), and the like.

As shown in FIG. 2, one end side of the composite cable 1 may be disposed on the side of the vehicle body or the undercarriage, and the other end side of the composite cable 1 may be disposed on the side of the wheels and/or the portion around the wheels. More specifically, one end of the pair of power supply lines 2 may be connected to the main electronic control unit 91 mounted on the vehicle body or the undercarriage, and the other end of the pair of power supply lines 2 may be connected to the subsidiary electronic control unit 92 mounted on the wheels and/or the portion around the wheels. Also, one end of the pair of signal lines 3 may be connected to the main electronic control unit 91, and the other end of the pair of signal lines 3 may be connected to the subsidiary electronic control unit 92. Further, a single motor sensor 940 or a plurality of motor sensors 940 for measurement to acquire information necessary for control of the motor 94, and the wheel velocity sensor 93 for detecting the rotation velocity of the wheels may be connected to the subsidiary electronic control unit 92. It is noted that the main electronic control unit 91 and the subsidiary electronic control unit 92 can be configured to be inter-communicable with each other via the pair of signal lines 3 of the composite cable 1. In addition, the wheel velocity sensor 93 may be connected to the subsidiary electronic control unit 92 by a sensor signal line 930 provided to the wheel velocity sensor 93. In the similar way, the motor sensors 940 may be connected to the subsidiary electronic control unit 92 by a pair of sensor signal lines 951, a pair of signal lines 952, a pair of signal lines 953, a pair of signal lines 954, and a pair of signal lines 955, each pair is equipped on the motor sensors 940, respectively. Further, the motor 94 may be connected to the subsidiary electronic control unit 92 via power supply lines 950 for the motor on the wheel side. It is noted that in the present embodiment, the motor 94 is a three-phase AC motor, and that the power supply lines 950 for the motor on the wheel side which connect the motor 94 and the subsidiary electronic control unit 92 are constituted of three power supply lines.

Figure 3:
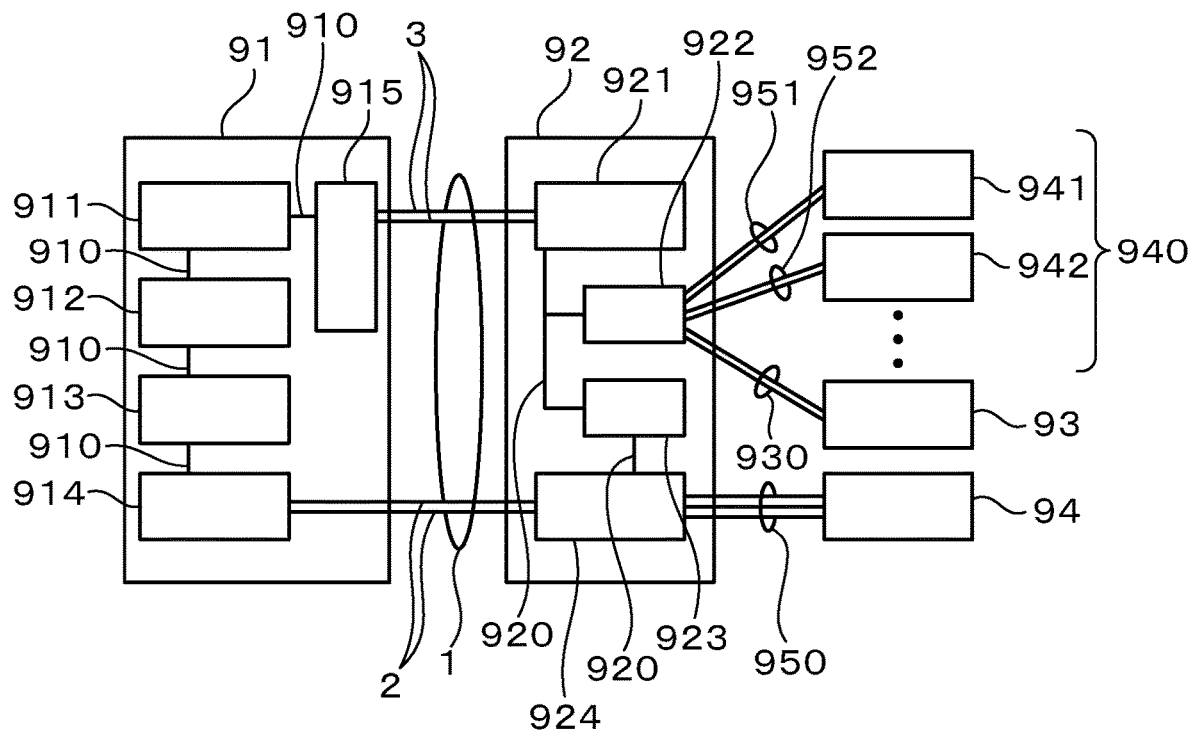
FIG. 3 is an illustration in which connection destinations of wires in the architecture shown in FIG. 2 are exemplified in detail.

FIG. 3 exemplifies connection destinations of the wires in the architecture 9 in detail. As exemplified in FIG. 3, the main electronic control unit 91 includes a braking command part 911, a main-side control operation part 912, a power determination part 913, a power supply part 914, and a main-side communication control part 915. In the main electronic control unit 91, the braking command part 911 and the main-side control operation part 912, the main-side control operation part 912 and the power determination part 913, the power determination part 913 and the power supply part 914, and the braking command part 911 and the main-side communication control part 915 are connected with each other via a main-side control wire 910. On the other hand, the subsidiary electronic control unit 92 includes a sub-side communication control part 921, a sensor information acquisition part 922, a sub-side control operation part 923, and a power supply conversion part 924. In the subsidiary electronic control unit 92, the sub-side communication control part 921, the sensor information acquisition part 922 and the sub-side control operation part 923 are connected by a sub-side control wire 920 for performing a braking function, and also the sub-side control operation part 923 and the power supply conversion part 924 are connected by the sub-side control wire 920 for performing a braking function. It is noted that the main-side control wire 910 and the sub-side control wire 920 may be specifically constituted of, for example, a printed wiring board, a thin wire, a bus bar, etc., and the connecting number is not particularly limited.

In the present embodiment, the one end of the pair of power supply lines 2 of the composite cable 1 is connected to the power supply part 914 of the main electronic control unit 91. And, the other end of the pair of power supply lines 2 of the composite cable 1 is connected to the power supply conversion part 924 of the subsidiary electronic control unit 92. The one end of the pair of signal lines 3 of the composite cable 1 is connected to the main-side communication control part 915 of the main electronic control unit 91. And the other end of the pair of signal lines 3 of the composite cable 1 is connected to the sub-side communication control part 921 of the subsidiary electronic control unit 92. The sensor signal lines 951, 952 ... each provided to the motor sensors 940 are connected to the sensor information acquisition part 922 of the subsidiary electronic control unit 92. The power supply lines 950 for the motor 94 on the wheel side are connected to the power supply conversion part 924 of the subsidiary electronic control unit 92.

In the main electronic control unit 91, the braking command part 911 sends an electrical signal for braking in accordance with the braking operation by an automobile driver, or an electrical signal in accordance with a target braking force by the automatic control function. The main-side control operation part 912 receives an input of the electrical signal sent from the braking command part 911 to perform conversion of the signal, recognition of the state quantity, determination processing, and so on, to thereby determine the braking force. The power determination part 913 determines the electric power to be energized on the basis of the operation result of the main-side control operation part 912. The power supply part 914 generates an electric power (DC) to be supplied upon receipt of the electrical signal from the power determination part 913. Meanwhile, in the subsidiary electronic control unit 92, the sub-side communication control part 921 is configured to be bidirectionally data-transmittable to the main-side communication control part 915 of the main electronic control unit 91 by digital communication. It is noted that for digital communication, a protocol, for example, a CAN communication protocol, etc. can be used. The sensor information acquisition part 922 receives an output of an analogue or digital quantity from the motor sensors 940 and the wheel velocity sensor 93, and is transmittable of an electrical signal to the braking command part 911 via the sub-side communication control part 921, the pair of signal lines 3 of the composite cable 1, and the main-side communication control part 915. On this occasion, a superimposed signal having an electrical signal concerning control of the motor 94, which is acquired by the motor sensors 940, superimposed with an electrical signal concerning a rotation velocity of wheels of an automobile, which is acquired by the wheel velocity sensor 93, is sent to the pair of signal lines 3 of the composite cable 1. The sub-side control operation part 923 has a function to perform operation processing on the basis of information acquired from the sensor information acquisition part 922, and is configured to be controllable of the power supply conversion part 924 (for example, ON/OFF control) based on the independent determination made in accordance with preset processing program. The power supply conversion part 924 performs DC-AC conversion and phase conversion upon receipt of power transmission from the power supply part 914 via the pair of power supply lines 2 of the composite cable 1. The motor 94 is driven by the power supplied from the power supply conversion part 924 via the power supply lines 950 for a motor on the wheel side. It is noted that various types of motor can be selected for the motor 94 depending on performance requirements of a braking system to be adopted, torque and/or response speed, etc. The number of poles of the input power source would differ, such as direct current, 3-phase alternating current, etc., depending on what type of motor would be selected. By providing the power supply conversion part 924 around the underbody as in the present embodiment, the main electronic control unit 91 on the side of a vehicle body or an undercarriage and the subsidiary electronic control unit 92 on the side of the wheels can be connected by the two power supply lines 2. Thus, there is no need to distinguish the power supply lines 2 of the composite cable 1 in accordance with the type of the motor 94, so that the lines can be standardized. In addition, in case the motor 94 such as 3-phase alternating current motor, in which two or more power supply lines 2 are required as an input power source, is used, the power supply lines of the composite cable 1 can be prevented from increasing in number, so that in the composite cable 1, the diameter can be reduced and the bending resistance can be increased.

The configuration inside the main electronic control unit 91 and the subsidiary electronic control unit 92 shown in FIG. 3 is just one example, and can be altered in various ways. For example, although not shown in the figures, a component having the equivalent function to the power determination part 913 of the main electronic control unit 91 may be arranged between the sub-side control operation part 923 and the power supply conversion part 924 in the subsidiary electronic control unit 92. This case can be configured so that the power supply part 914 of the main electronic control unit 91 supplies a certain amount of electric power to the power supply conversion part 924 of the subsidiary electronic control unit 92 via the pair of power supply lines 2 of the composite cable 1, and the same processing as mentioned above is performed in the sub-side control operation part 923 so as to drive the motor 94. According to this configuration, it is made possible to precisely control the electric power to be supplied to the motor 94 without depending on the electric resistance of the pair of power supply lines 2 of the composite cable 1.

Next, as a comparison to the composite cable 1 for use in the architecture 9 of the present embodiment, a composite cable 1C for use in an architecture 9C of Comparative Embodiment 1 will be briefly described with reference to FIG. 4 and FIG. 5.

Figure 4:
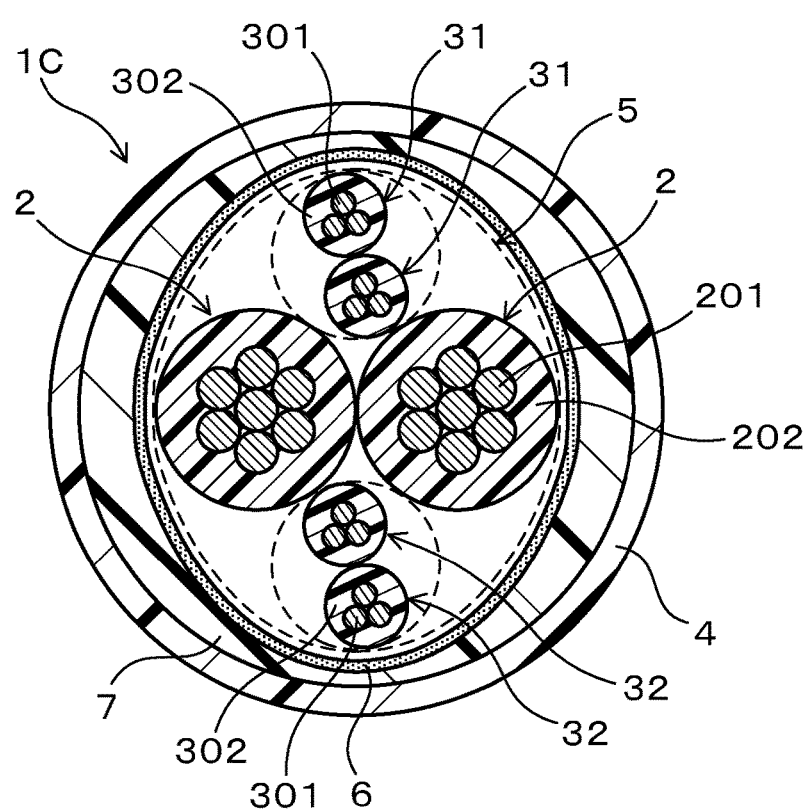
FIG. 4 is an illustration schematically showing a cross section of a composite cable for use in an architecture according to Comparative Embodiment 1, the cross section being perpendicular to the center axis of the cable.
Figure 5:
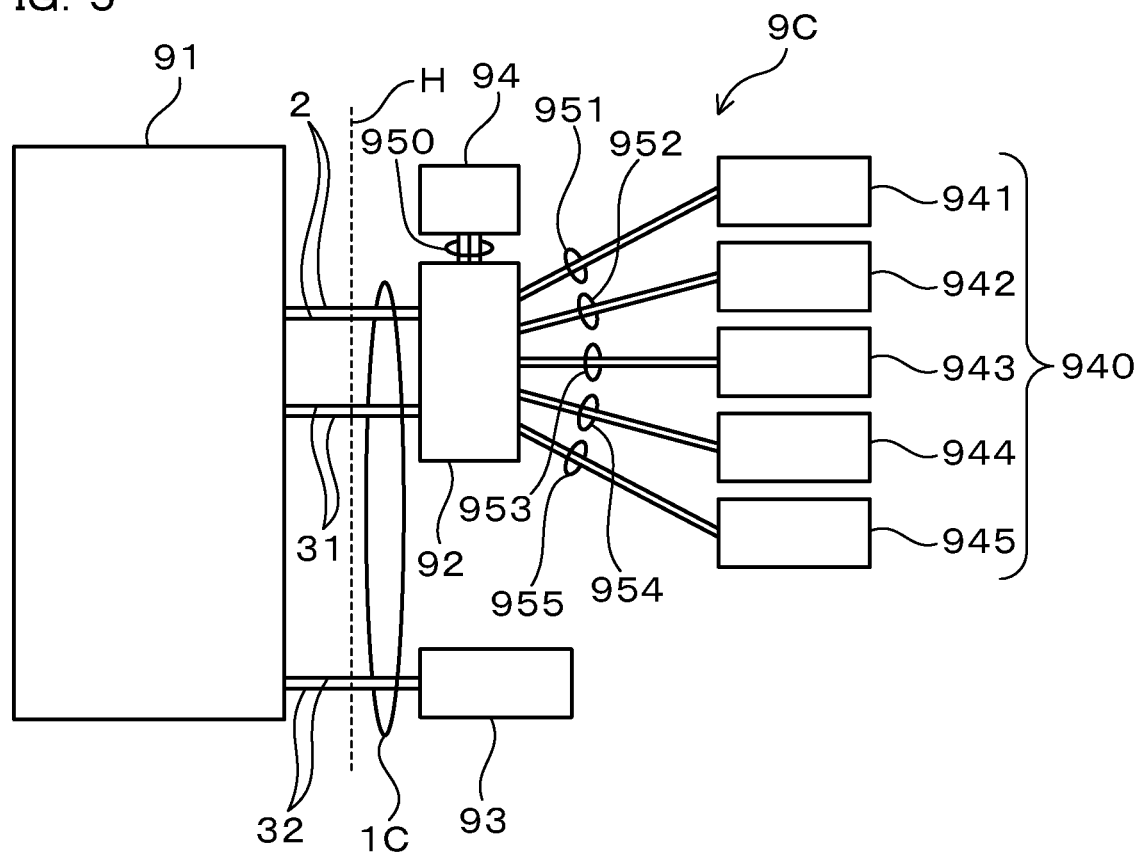
FIG. 5 is an illustration for explaining the architecture according to Comparative Embodiment 1.

The composite cable 1C is of a six-core cable structure as shown in FIG. 4. Specifically, the composite cable 1C differs from the composite cable 1 for use in the architecture 9 of Embodiment 1 in that it includes a pair of power supply lines 2, a pair of signal lines 31, a pair of another signal lines 32, and a sheath 4. In FIG. 5, an architecture 9C of Comparative Embodiment 1 is shown. As shown in FIG. 5, in the composite cable 1C, the pair of signal lines 31 connects the main electronic control unit 91 and the subsidiary electronic control unit 92. The wheel velocity sensor 93 is not connected to the subsidiary electronic control unit 92, and is connected to the main electronic control unit 91 via the pair of another signal lines 32 for the wheel velocity sensor 93. In other words, the composite cable 1C is an example in which a plurality of wires required for a cable are bunched together to form a six-core cable structure. In the architecture 9C of Comparative Embodiment 1, an electrical signal concerning control of the motor 94, which has been acquired by the motor sensors 940, is sent to the pair of signal lines 31. In addition, an electrical signal concerning a rotation velocity of wheels of the automobile acquired by the wheel velocity sensor 93 is sent to the pair of signal lines 32 of the composite cable 1C.

In the architecture 9 of the present embodiment, the composite cable 1 has the above-mentioned configuration. Specifically, in the composite cable 1, the pair of power supply lines 2 is configured to supply an electric power for driving the motor 94 equipped on a brake caliper of an automotive electric brake, and the pair of signal lines 3 is configured to transmit the superimposed signal having an electrical signal concerning control of the motor 94 superimposed with an electrical signal concerning a rotation velocity of wheels of the automobile.

Thus, the architecture 9 of the present embodiment makes it possible to reduce a cable diameter in comparison with the architecture 9C of the comparative embodiment using the composite cable 1C, in which the pair of power supply lines 2 is configured to supply an electric power for driving the motor 94 equipped on a brake caliper of an automotive electric brake, the pair of signal lines 31 is configured to transmit an electrical signal concerning control of the motor 94, and the pair of another signal lines 32 is configured to transmit an electrical signal concerning a rotation velocity of wheels of the automobile.

In the composite cable 1, the pair of signal lines 3 may be configured not to be covered with a shield conductor. This configuration is advantageous for reduction of a cable diameter in comparison with the case in which the signal lines 3 are covered with the shield conductor. Further, in the composite cable 1, the pair of power supply lines 2 may be configured not to be covered with the shield conductor. This configuration is advantageous for reduction of the cable diameter in comparison with the case in which the power supply lines 2 are covered with the shield conductor. In the composite cable 1, it is preferable that both of the pair of signal lines 3 and the pair of power supply lines 2 are configured not to be covered with the shield conductor from the viewpoint that reduction of a cable diameter can be more easily achieved, and so on.

It is noted that there occurs a concern that a noise from the power supply lines 2 and/or a noise from the outside may affect the signal lines 3 when both of the pair of signal lines 3 and the pair of power supply lines 2 are configured not to be covered with the shield conductor. However, by using a superimposed digital signal as a superimposed signal, communication of the electrical signal concerning error correction, reduction of transmission speed, and the like can be performed. In other words, this configuration makes it possible to take measures for digitally preventing the noises, and makes it possible to perform satisfactory communication without any shield conductor. On the other hand, in case an analog signal is used as the superimposed signal, there is an advantage that information concerning a rotation velocity of wheels is easily monitored in real time during the travelling of an automobile independently from the status of the subsidiary electronic control unit 92.

Figure 6:
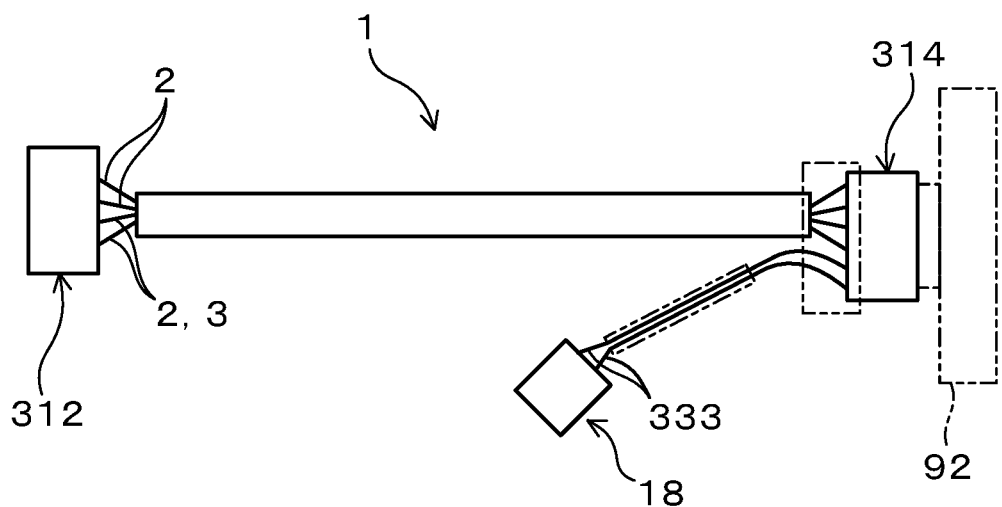
FIG. 6 is a view showing a more specific aspect of the composite cable for use in the architecture according to Embodiment 1.

In FIG. 6, a more specific aspect of the composite cable 1 is shown.

As exemplified in FIG. 6, a first connector 312 is connected to one end of the composite cable 1 via the power supply lines 2, the signal lines 3, etc. The first connector 312 is connected to the main electronic control unit 91. The main electronic control unit 91 is disposed inside an automobile. On the other hand, to the other end of the composite cable 1, a second connector 314 is connected. The second connector 314 is connected to the subsidiary electronic control unit 92. From the second connector 314, sub-wires 333 (signal lines) are extended, and at the ends of the sub-wires 333, a third connector 18 is arranged. The third connector 18 is connected to the wheel velocity sensor 93. Here, a signal transmitted from the wheel velocity sensor 93 passes through the composite cable 1 via a circuit in the subsidiary electronic control unit 92 and is received by the main electronic control unit 91.

As exemplified in FIG. 6, the signal lines of the wheel velocity sensor 93 are connected to the second connector 314 with the sub-wires 333, the grounds for which will be described.

For example, in the case of a composite cable having connection destinations branched, for a previously-existing composite cable, a sheath has been branched as a conventional measure. In this case, the length of the wire from the first connector 312 to the second connector 314, and the length of the wire from the first connector 312 to the third connector 18 differ from each other. For example, in case the length of the wire from the first connector 312 to the second connector 314 is shorter in comparison with the length from the first connector 312 to the third connector 18, the wire needs to be partly cut. Such a process as cutting the wire is desired to be eliminated from the viewpoints of production cost and production process. From such viewpoints, the present inventors have arrived at a configuration such that the second connector 314 and the third connector 18 are connected using the sub-wire 333.

Using the foregoing sub-wire 333 is convenient for the reason that a process of manufacturing the composite cable 310 can be automated.

Further, the signal transmitted from the wheel velocity sensor 93 is received by the main electronic control unit 91 via a circuit in the subsidiary electronic control unit 92, the grounds for which will be described.

For a previously-existing composite cable, for instance, by providing a circuit inside the second connector 314, the signal from the wheel velocity sensor 93 was transmitted to the main electronic control unit 91 not through the subsidiary electronic control unit 92.

However, there is a demand for downsizing a connector as small as possible when designing a device such as the subsidiary electronic control unit 92. This is because the connector is merely a gateway with no function, unlike the device. For this purpose, the present inventors conceived the idea to transmit the signal from the wheel velocity sensor 93 to the composite cable 1 and the main electronic control unit 91 using a circuit in the subsidiary electronic control unit 92 in place of providing a circuit in the second connector 314. Such a conception is convenient for the reason that the connector 314 can be downsized.

Embodiment 2

A composite cable for use in an architecture according to Embodiment 2 will be described with reference to FIG. 7.

Figure 7:
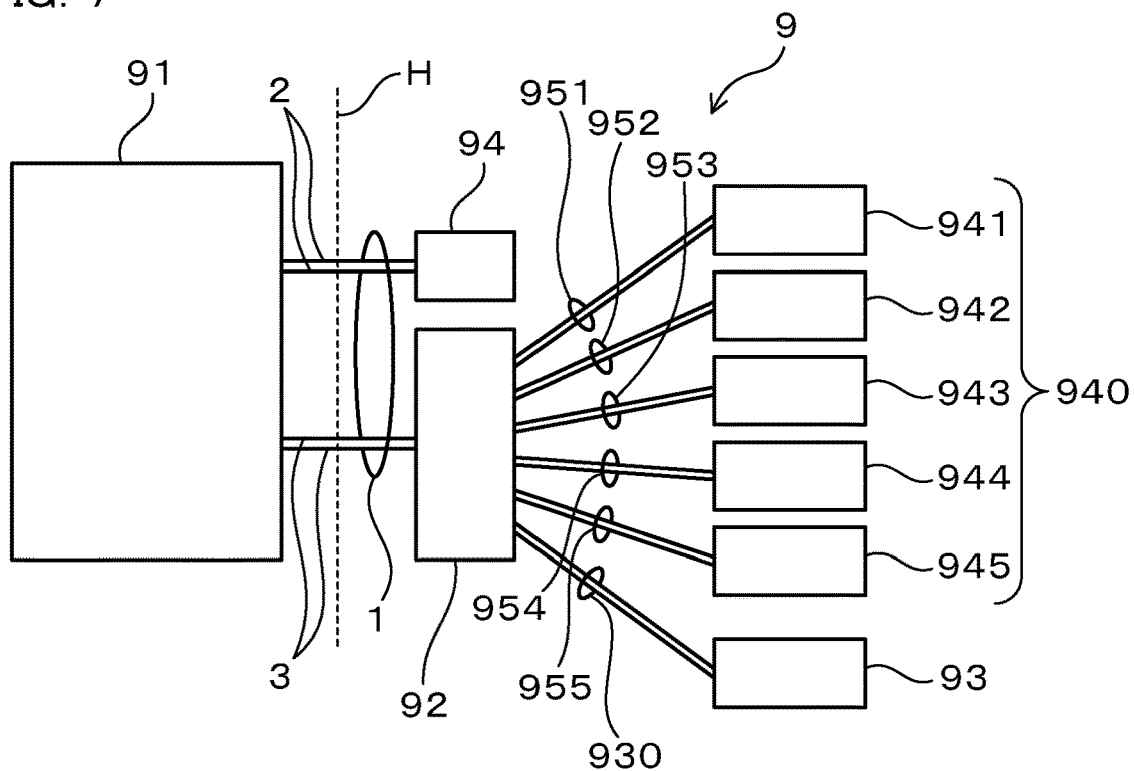
FIG. 7 is an illustration for explaining an architecture according to Embodiment 2.

In the present embodiment, as shown in FIG. 7, one end of the pair of the power supply lines 2 of the composite cable 1 is connected to the main electronic control unit 91, and the other end of the pair of power supply lines 2 is directly connected to the motor 94 not through the subsidiary electronic control unit 92. More specifically, although not shown in the figures, the one end of the pair of the power supply lines 2 of the composite cable 1 is connected to the power supply part 914 of the main electronic control unit 91. And, the other end of the pair of power supply lines 2 of the composite cable 1 is not connected to the power supply conversion part 924 of the subsidiary electronic control unit 92, but is connected to the motor 94. The motor 94 is a DC motor. In this case, the power supply conversion part 924 of the subsidiary electronic control unit 92 can be configured to control only transmission and transmission stop of the electric power to be supplied to the motor 94, such as ON/OFF control. According to this configuration, the number of control circuits of the power supply conversion part 924 is reduced, consequently the effects of reduction in the failure rate, reduction in the cost, etc. can be expected. The other configuration and operational effects are the same as those in Embodiment 1.

Embodiment 3

A composite cable for use in an architecture according to Embodiment 3 will be described with reference to FIG. 8.

Figure 8:
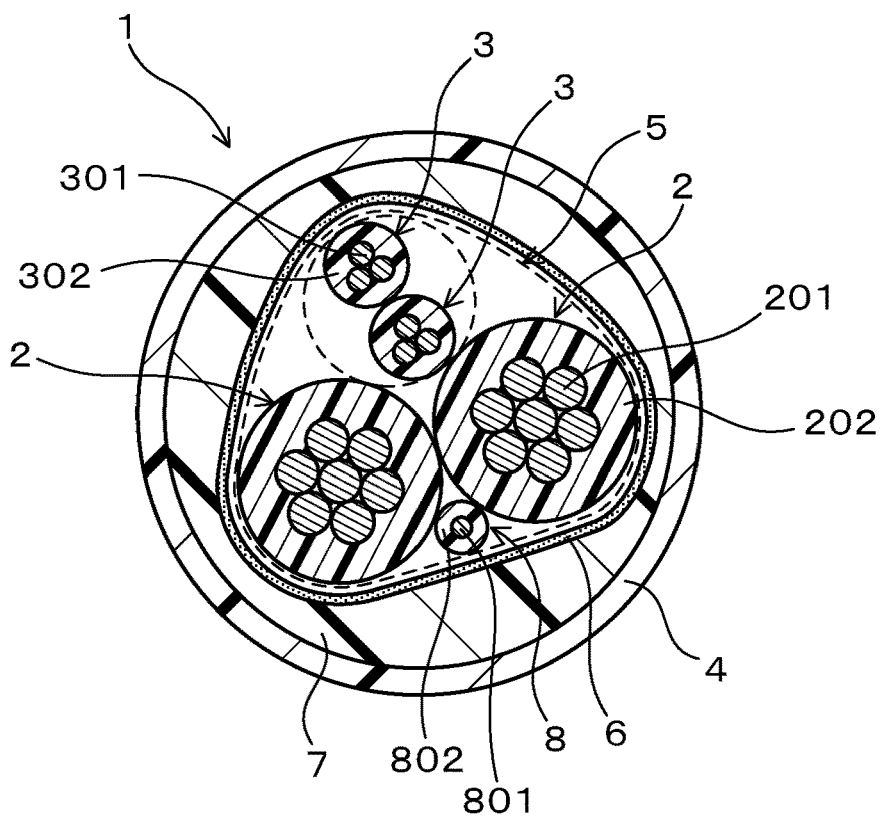
FIG. 8 is an illustration schematically showing a cross section of a composite cable for use in an architecture according to Embodiment 3, the cross section being perpendicular to the center axis of the cable.

In the present embodiment, as exemplified in FIG. 8, the composite cable 1 further includes a ground wire 8 inside the sheath 4.

In the present embodiment, specifically, the ground wire 8 is twisted together with the pair of power supply lines 2 and the pair of signal lines 3. In other words, the wire bundle 5 includes the ground wire 8.

According to this configuration, there is the following advantage in case the pair of signal lines 3 and/or the pair of power supply lines 2 are/is covered with the shield conductor. In other words, on one end side of the cable, the shield conductor can be grounded on the vehicle body or undercarriage, however, the other end side of the cable is located on the side of the wheels or a portion around the wheels, the shield conductor can be hardly grounded thereon. In the case of including the ground wire 8 as in the present embodiment, the shield conductor and the ground wire 8 can be connected on the other end side of the cable. Accordingly, this configuration makes it possible for the shield conductor to surely exhibit its shieldability even under the condition where grounding of the composite cable on the wheel side of an automobile is restricted such as in the case of the composite cable 1 for an electric brake. Further, there are advantages, for example, even in case no shield conductor is provided, the ground wire 8 makes it possible to equalize the potential to that on the side of the vehicle body or undercarriage by connection to the ground wire 8 to the ground of the subsidiary electronic control unit 92.

It is noted that the ground wire 8 may be configured to include, specifically, a conductor 801, and an insulator 802 covering the outer circumference of the conductor 801. The conductor 801 may be formed of, for example, copper or copper alloy, or aluminum or aluminum alloy, or the like. The insulator 802 may be formed of, for example, cross-linked polyethylene (PE), or the like. The other configuration and operational effects are the same as those in Embodiment 1.

The present invention is not limited to the above-mentioned embodiments, and various modifications can be made within the scope that does not depart from the spirit of the present invention. The configuration shown in each embodiment can be arbitrarily combined with each other.

The invention claimed is:

1. An architecture comprising:
   a composite cable including a first connector and a second connector having a sub wire extending from the second connector, the sub wire has a third connector connected to the sub wire;
   a main electronic control unit, the first connector being connected to the main electronic control unit;
   a subsidiary electronic control unit, the second connector being connected to the subsidiary electronic control unit, and the composite cable connects the main electronic control unit and the subsidiary electronic control unit;
   a motor sensor; and
   a wheel velocity sensor, the third connector being connected to the wheel velocity sensor, and the motor sensor and the wheel velocity sensor are connected to the subsidiary electronic control unit, the wheel velocity sensor transmits a signal that passes through the composite cable via a circuit in the subsidiary electronic control unit, and the signal transmitted by the wheel velocity sensor is received by the main electronic control unit.

2. The architecture according to claim 1, wherein the main electronic control unit and the subsidiary electronic control unit transmit and receive a controller area network (CAN) communication.

3. The architecture according to claim 2, wherein the composite cable includes a pair of power supply lines, a pair of signal lines, and a sheath that covers the pair of power supply lines and the pair of signal lines together.

4. The architecture according to claim 3, wherein the pair of signal lines is not covered with a shield conductor.

5. The architecture according to claim 4, wherein the pair of power supply lines is not covered with the shield conductor.

6. The architecture according to claim 3, wherein the pair of power supply lines is not covered with a shield conductor.

7. The architecture according to claim 1, wherein the composite cable includes a pair of power supply lines, a pair of signal lines, and a sheath that covers the pair of power supply lines and the pair of signal lines together.

8. The architecture according to claim 7, wherein the pair of signal lines is not covered with a shield conductor.

9. The architecture according to claim 8, wherein the pair of power supply lines is not covered with the shield conductor.

10. The architecture according to claim 7, wherein the pair of power supply lines is not covered with a shield conductor.

11. The architecture according to claim 7, wherein
    the pair of power supply lines and the pair of signal lines are twisted together to constitute a wire bundle, and
    the wire bundle and the sheath are provided therebetween with an intermediate layer covering the wire bundle.

12. The architecture according to claim 11, further comprising a ground wire inside the sheath.

13. The architecture according to claim 7, further comprising a ground wire inside the sheath.

* * * * *